(12) United States Patent  
Sakurai et al.

(10) Patent No.: US 6,918,705 B2
(45) Date of Patent: Jul. 19, 2005

(54) OPTICAL MODULE AND METHOD OF MANUFACTURE THEREOF, SEMICONDUCTOR DEVICE, AND OPTICAL TRANSMISSION DEVICE

(75) Inventors: Kazunori Sakurai, Chino (JP); Kazushige Umetsu, Chino (JP); Akihiro Murata, Takane-cho (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/633,623

(22) Filed: Aug. 5, 2003

(65) Prior Publication Data

US 2004/0028352 A1 Feb. 12, 2004

Related U.S. Application Data

(63) Continuation of application No. 09/593,462, filed on Jun. 14, 2000, now Pat. No. 6,623,178.

(30) Foreign Application Priority Data

Jun. 16, 1999 (JP) .......................................... 11-169659
Apr. 18, 2000 (JP) ...................................... 2000-116438

(51) Int. Cl.⁷ ................................................. G02B 6/36
(52) U.S. Cl. ............................ 385/88; 385/92; 385/94
(58) Field of Search .................................... 385/88–94

(56) References Cited

U.S. PATENT DOCUMENTS 4,656,352 A    4/1987   Langenwalter et al. ....... 385/93
4,826,272 A    5/1989   Pimpinella ..................... 385/92
4,830,450 A    5/1989   Connell et al. ................ 385/94
4,989,934 A    2/1991   Zavracky et al. .............. 385/14
5,345,529 A    9/1994   Sizer, II et al. ................ 385/88
5,416,872 A    5/1995   Sizer, II et al. ................ 385/92
5,675,684 A   10/1997   Hirataka ....................... 385/88
5,763,900 A    6/1998   Wang ........................... 257/81
6,100,595 A    8/2000   Jaouen ......................... 385/92
6,214,643 B1   4/2001   Chiu .......................... 438/108
6,269,209 B1   7/2001   Terada .......................... 385/51
6,301,401 B1  10/2001   La ............................... 385/14
6,668,125 B2 * 12/2003  Go ............................. 385/134

FOREIGN PATENT DOCUMENTS

| EP | 0 613 032 A2 | 8/1994 |
| EP | 0 889 533 A2 | 1/1999 |
| JP | 8-110443 | 4/1996 |
| JP | A-10-339824 | 12/1998 |
| JP | 2000-35504 | 2/2000 |

* cited by examiner

Primary Examiner—Akm Enayet Ullah
Assistant Examiner—Kevin S Wood
(74) Attorney, Agent, or Firm—Oliff & Berridge, PLC

(57) ABSTRACT

An optical module comprising: an optical fiber; an optical element having an optical section and with a fixed position relative to the optical fiber; and a semiconductor chip electrically connected to the optical element, and the optical element and semiconductor chip being packaged. A hole is formed in the semiconductor chip, and the optical element is mounted on the semiconductor chip with the optical section facing the hole, and the optical fiber is inserted in the hole and fitted to the semiconductor chip.

10 Claims, 8 Drawing Sheets

OPTICAL MODULE AND METHOD OF MANUFACTURE THEREOF, SEMICONDUCTOR DEVICE, AND OPTICAL TRANSMISSION DEVICE

This is a Continuation of application Ser. No. 09/593,462 filed Jun. 14, 2000, now U.S. Pat. No. 6,623,178. The entire disclosure of the prior application is hereby incorporated by reference herein in its entirety.

BACKGROUND OF THE INVENTION

1. Field of the Invention

The present invention relates to an optical module and method of manufacture thereof, to a semiconductor device, and to an optical transmission device.

2. Description of Related Art

In recent years, there has been a trend toward increased speeds and volumes in data communications, and developments in optical communications continue. Generally, in optical communications, an electrical signal is converted to an optical signal, the optical signal is transmitted through an optical fiber, and then the received optical signal is converted to an electrical signal. The conversion between electrical signals and optical signals is done by optical elements.

For example, Japanese Patent Application Laid-Open No. 10-339824 discloses an optical fiber positioned and fixed on a platform in which a V-groove is formed, to constitute an optical module.

However, a conventional optical module has an optical fiber and optical element formed integrally, and it is further necessary to electrically connect this optical module to a semiconductor chip.

SUMMARY OF THE INVENTION

The present invention solves this problem, and has as its objective the provision of an optical module not requiring connection to a semiconductor chip and method of manufacture thereof, of a semiconductor device and of an optical transmission device.

(1) According to a first aspect of the present invention, there is provided an optical module of the present invention comprising:

an optical waveguide;

an optical element having an optical section; and a semiconductor chip electrically connected to the optical element, wherein the optical element and the semiconductor chip are packaged.

According to this aspect of the present invention, the optical element and semiconductor chip are packaged, and the semiconductor chip is incorporated into the optical module. Therefore, further connection of the optical module to a semiconductor chip is not required, and handling is made easier.

(2) In this optical module, a hole may be formed in the semiconductor chip; the optical waveguide may be inserted into the hole; and the optical element may be disposed so that the optical section and one end surface of the inserted optical waveguide are opposed.

By means of this, the optical waveguide is positioned by the hole formed in the semiconductor chip, and therefore the positioning accuracy of the optical section of the optical element and the end surface of the optical waveguide is increased.

(3) In this optical module, the hole may be a through hole.

(4) In this optical module, a light-transmitting sealant may be provided at the through hole.

By means of this, the optical waveguide is contacted with the sealant, and the positioning achieved.

(5) In this optical module, an underfill material may be provided between the optical element and the semiconductor chip.

By means of this, the optical element and semiconductor chip are protected, and also the connection therebetween can be made stable.

(6) In this optical module, an interconnect pattern may be formed on the semiconductor chip; a plurality of electrodes may be formed on the optical element; and at least one of the plurality of electrodes may be electrically connected to the interconnect pattern.

By means of this, since the optical element is mounted on the semiconductor chip, the optical module can be made more compact. To the semiconductor material constituting the semiconductor chip, the method of manufacture of the semiconductor device can be applied, and an interconnect pattern of high accuracy can be formed.

(7) This optical module may further comprise a substrate for supporting at least either of the semiconductor chip and the optical element.

(8) In this optical module, the substrate may assist the dispersion of heat from at least either of the semiconductor chip and the optical element.

(9) This optical module may further comprise external terminals provided on the substrate, and electrically connected to at least either of the optical element and the semiconductor chip.

(10) In this optical module, the semiconductor chip and the optical element may be sealed with resin.

By means of this, the semiconductor chip and optical element are protected by the resin.

(11) According to a second aspect of the present invention, there is provided a semiconductor device comprising: an optical element having an optical section; and a semiconductor chip electrically connected to the optical element, wherein the optical element and the semiconductor chip are packaged.

According to this aspect of the present invention, since the optical element and semiconductor chip are packaged, further connection of the optical module and semiconductor chip is not required, and handling is made easier.

(12) In this semiconductor device, the optical element and the semiconductor chip may be stacked.

(13) In this semiconductor device, a hole may be formed in the semiconductor chip; the optical element may be disposed so that one end surface of the semiconductor chip and the optical section are opposed; and the optical element and the semiconductor chip may be stacked.

(14) In this semiconductor device, the optical element and the semiconductor chip may be disposed on a substrate.

(15) In this semiconductor device, a hole may be formed in the substrate; the optical element may be disposed so that one end surface of the semiconductor chip and the optical section are opposed; and the optical element may be disposed on the substrate.

(16) According to a third aspect of the present invention, there is provided an optical transmission device comprising:

an optical waveguide;

a light-emitting element mounted with a light-emitting section facing one end surface of the optical waveguide;

a semiconductor chip electrically connected to the light-emitting element and packaged with the light-emitting element;

a light-receiving element mounted with a light-receiving section facing the other end surface of the optical waveguide; and a semiconductor chip electrically connected to the light-receiving element and packaged with the light-receiving element.

According to this aspect of the present invention, the light-emitting element or light-receiving element and the semiconductor chip are packaged, and incorporate a semiconductor chip. Therefore, further connection between the light-emitting element or light-receiving element and the semiconductor chip is not required, and handling is made easier.

(17) This optical transmission device may further comprise: a plug connected to the light-emitting element; and a plug connected to the light-receiving element.

(18) According to a fourth aspect of the present invention, there is provided a method of manufacture of an optical module having at least an optical waveguide, an optical element having an optical section, and a semiconductor chip. This method comprises the steps of:

electrically connecting the optical element and the semiconductor chip;

relatively positioning the optical waveguide and the optical element; and packaging the optical element and the semiconductor chip.

According to this aspect of the present invention, the optical element and semiconductor chip are packaged, and further connection of the optical module obtained to a semiconductor chip is not required, and handling is made easier.

(19) In this method of manufacture of an optical module, an interconnect pattern may be formed on the semiconductor chip; the optical element may have a plurality of electrodes; and the step of electrically connecting the optical element and the semiconductor chip may bond at least one of the plurality of electrodes to the interconnect pattern.

By means of this, merely by bonding the electrodes to the interconnect pattern, the electrical connection between the optical element and semiconductor chip can be achieved simply. Since the optical element is mounted on the semiconductor chip, the optical module can be made more compact. To the semiconductor material constituting the semiconductor chip, the method of manufacture of the semiconductor device can be applied, and an interconnect pattern of high accuracy can be formed.

(20) In this method of manufacture of an optical module, the electrode and the interconnect pattern may be bonded with a soldering material; and the positions of the optical element and semiconductor chip may be determined by the surface tension of the fused soldering material.

By means of this, by the surface tension of the soldering material the positioning of the optical element and semiconductor chip is carried out, and therefore a positioning step is not required.

(21) In this method of manufacture of an optical module, a hole may be formed in the semiconductor chip; and the step of relatively positioning the optical waveguide and the optical element may include a step of inserting the optical waveguide into the hole.

By means of this, by inserting the optical waveguide into the hole, the positioning of the optical waveguide and semiconductor chip is determined. Therefore, if the positioning of the optical element and semiconductor chip is carried out, the positioning of the optical element and optical waveguide can be carried out simply.

(22) In this method of manufacture of an optical module, the hole may be formed by a laser.

(23) In this method of manufacture of an optical module, the hole may be formed by etching.

(24) This method of manufacture of an optical module may further comprise a step of forming a depression in the region in which the hole is to be formed in the semiconductor chip by anisotropic etching, and then penetrating the depression by a laser, to form the hole in the semiconductor chip.

Anisotropic etching is widely carried out by the process of manufacture of a semiconductor device, and allows a depression of high accuracy to be formed. By means of anisotropic etching, the cross-section of the depression forms a V-shape, and therefore a hole formed by penetrating the depression with a laser has opening extremities which are tapered. Therefore, a hole with tapered opening extremities can be formed simply. The hole taper acts as a guide when the optical waveguide is inserted.

(25) This method of manufacture of an optical module may further comprise a step of providing an underfill material between the semiconductor chip and the optical element.

By means of this, by means of the underfill material, the optical element and semiconductor chip can be protected, and also the connection therebetween can be made stable.

(26) In this method of manufacture of an optical module, the step of packaging the optical element and the semiconductor chip may comprise sealing the optical element and the semiconductor chip with a resin.

By means of this, the semiconductor chip and optical element can be protected by the resin.

(27) This method of manufacture of an optical module may further comprise a step of providing a substrate to at least either of the semiconductor chip and the optical element.

(28) This method of manufacture of an optical module may further comprise a step in which external terminals electrically connected to at least either of the optical element and the semiconductor chip are provided on the substrate.

DETAILED DESCRIPTION OF THE PREFERRED EMBODIMENTS

The present invention is now described in terms of a number of preferred embodiments, with reference to the drawings.

First Embodiment

Figure 1:
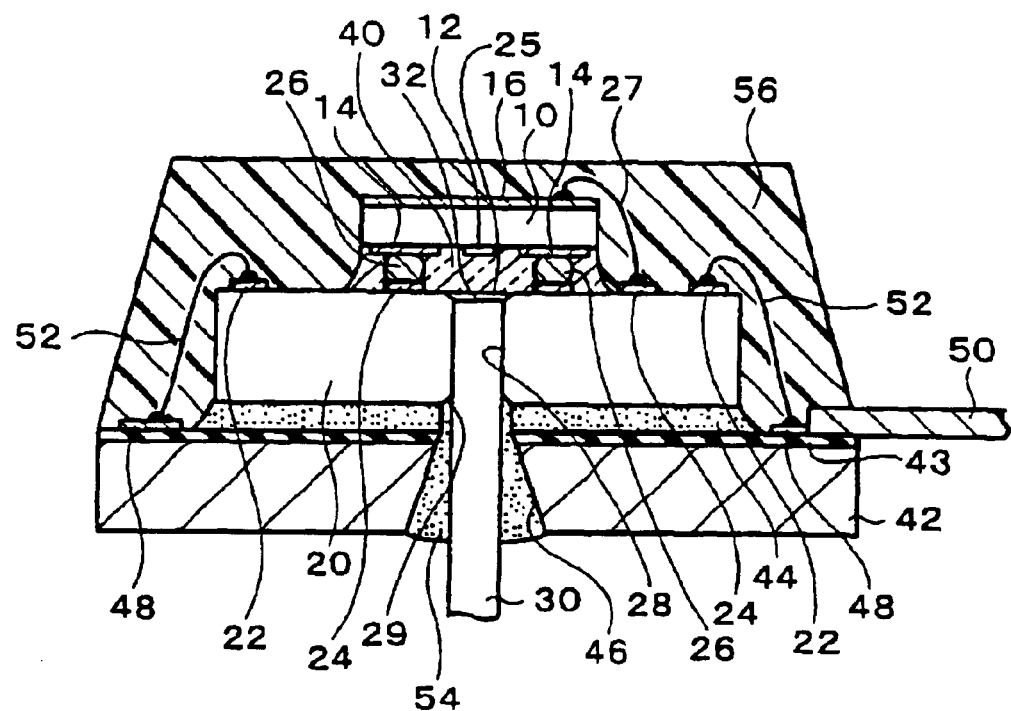
FIG. 1 shows a first embodiment of an optical module to which the present invention is applied.

FIG. 1 shows a first embodiment of an optical module to which the present invention is applied. The optical module comprises an optical element 10, a semiconductor chip 20, and an optical fiber 30. The optical fiber 30 is an example of an optical waveguide. Since this optical module includes the semiconductor chip 20, it may also be defined as a semiconductor device. This applies similarly to all of the below embodiments.

The optical element 10 may be a light-emitting element or a light-receiving element. As an example of a light-emitting element may be used a surface emitting element, and particularly a surface emitting laser. A surface emitting element such as a surface emitting laser emits light in a direction perpendicular to the substrate. The optical element 10 includes an optical section 12. When the optical element 10 is a light-emitting element, the optical section 12 is a light-emitting section, and when the optical element 10 is a light-receiving element, the optical section 12 is a light-receiving section.

The optical element 10 is fixed in relative position with respect to the optical fiber 30. More specifically, the optical section 12 of the optical element 10 and the end surface of the optical fiber 30 are preferably fixed in relative position. In more concrete terms, the optical section 12 is commonly disposed to oppose the end surface of the optical fiber 30. In this embodiment, the optical section 12 faces a hole 28 in the semiconductor chip 20.

The optical element 10 has at least one (generally two or more) electrodes. For example, on the surface on which the optical section 12 is formed, first electrodes 14 may be provided. It should be noted that of the plurality of first electrodes 14, at least one may be a dummy electrode. A dummy electrode may be formed of the same material as the first electrodes 14, but has no electrical connection within the optical element 10. For example, when the first electrodes 14 are formed such that if joined by straight lines they form a polygon of at least three sides, one or more thereof may be dummy electrodes. By this means, the optical element 10 can be stably supported with at least three points of fixture.

On a surface different from the surface on which the first electrodes 14 are provided, second electrodes 16 may be provided. When the optical element 10 is a surface light-emitting laser or other semiconductor laser, the second electrodes 16 may be provided on the opposite surface to the surface on which the first electrodes 14 are provided.

The semiconductor chip 20 is for driving the optical element 10. The semiconductor chip 20 has an internal circuit for driving the optical element 10. On the semiconductor chip 20 are formed a plurality of electrodes (or pads) 22 which are electrically connected to the internal circuit. On the surface on which the electrodes 22 are formed, an interconnect pattern 24 electrically connected to at least one electrode 22 is preferably formed.

The semiconductor chip 20 and optical element 10 are electrically connected. For example, the first electrodes 14 of the optical element 10 and the interconnect pattern 24 formed on the semiconductor chip 20 are electrically connected. For the connection, wires or the like may be used, or a metal bond of solder 26 or the like as a soldering material, or the first electrodes 14 and the interconnect pattern 24 may be bonded with an anisotropic conductive material (film) interposed. In this case, the optical element 10 is mounted face-down on the semiconductor chip 20. By means of this, not only can the electrical connection be made by the solder 26, but also the optical element 10 and semiconductor chip 20 can be fixed by the solder 26. It should be noted that of the first electrodes 14, those which are dummy electrodes are also preferably connected to the interconnect pattern 24. By means of this, the optical element 10 can be fixed to the semiconductor chip 20 in a stable state.

The second electrodes 16 of the optical element 10 and the interconnect pattern 24 are electrically connected. For the connection, wires 27 or the like may be used, or a conductive paste may be provided from the second electrodes 16 to the interconnect pattern 24.

Between the optical element 10 and semiconductor chip 20, an underfill material 40 may be provided. When the underfill material 40 covers the optical section 12 of the optical element 10, it is preferable for the underfill material 40 to be transparent. The underfill material 40 covers and protects the electrical connection between the optical element 10 and the semiconductor chip 20, and also protects the surface of the optical element 10 and semiconductor chip 20. Furthermore, the underfill material 40 maintains the bonding between the optical element 10 and semiconductor chip 20.

In the semiconductor chip 20, a hole (such as a through hole) 28 may be formed. The optical fiber 30 passes through the hole 28. The hole 28 is formed to avoid the internal circuit, and to extend from the surface where the electrodes 22 are formed to the opposite surface. In the hole 28 may be provided a light-transmitting sealant 25 in the opening of the surface in which the electrodes 22 are formed. By providing the sealant 25 one end of the hole 28 is sealed, and positioning of the end of the optical fiber 30 can be achieved. The sealant 25 can be provided by forming the hole 28 from the surface (the rear surface) opposite to the surface on which the sealant 25 is provided, and leaving a passivation film of $SiO_2$, or $SiN_x$, or the like formed on the surface (the front surface) on which the sealant 25 is provided. At at least one opening extremity of the hole 28, a taper 29 is preferably formed. By forming the taper 29, it is made easier to insert the optical fiber 30 into the hole 28.

The semiconductor chip 20 may be mounted on a substrate 42. More specifically, the semiconductor chip 20 may be adhered to the substrate 42 by an adhesive 44. In the substrate 42 a hole 46 is formed. The hole 46 is formed in a position to communicate with the hole 28 in the semiconductor chip 20. The adhesive 44 adhering the semiconductor chip 20 and the substrate 42 is provided so as not to block the two holes 28 and 46, in order not to impede communication therebetween. The hole 46 in the substrate 42 is formed with a taper so as to have an internal diameter which is larger on the side opposite to the semiconductor chip 20. By means of this, it is made easier to insert the optical fiber 30.

The substrate 42 may be formed of an insulating material such as resin, glass, or ceramic, but may also be formed of a conductive material such as metal. When the substrate 42 is of a conductive material, at least on the surface on which the semiconductor chip 20 is attached, an insulating film 43 is preferably formed. It should be noted that in the below embodiments also, similar materials can be used for the substrate 42.

The substrate 42 preferably has high thermal conductivity. According to this, the substrate 42 assists the dispersion of heat from at least one of the optical element 10 and semiconductor chip 20. In this case, the substrate 42 is a heat sink or heat spreader. In this embodiment, since the semiconductor chip 20 is adhered to the substrate 42, the semiconductor chip 20 can be cooled directly. It should be noted that the adhesive 44 adhering the semiconductor chip 20 and substrate 42 is preferably thermally conductive. Furthermore, since the semiconductor chip 20 is cooled, the optical element 10 bonded to the semiconductor chip 20 is also cooled.

On the substrate 42 is provided an interconnect pattern 48. On the substrate 42 are provided external terminals 50. In this embodiment, the external terminals 50 are leads. The interconnect pattern 48 formed on the substrate 42 is connected, for example by wires 52, to at least one of the electrodes 22 of the semiconductor chip 20, the interconnect pattern 24 formed on the semiconductor chip 20, and the first and second electrodes 14 and 16 of the optical element 10. The interconnect pattern 48 may be electrically connected to the external terminals 50.

The optical fiber 30 includes a core and a cladding which concentric-circularly surrounds the core, so that light is reflected by the boundary between the core and the cladding, trapped within the core, and thus transmitted. The periphery of the cladding is commonly protected by a jacket.

The optical fiber 30 is inserted into the hole 28 in the semiconductor chip 20. The optical section 12 of the optical element 10 faces into the hole 28 in the semiconductor chip 20. Therefore, the optical fiber 30 inserted into the hole 28 is positioned with respect to the optical section 12.

The optical fiber 30 is also passed through the hole 46 in the substrate 42. The hole 46 has an internal diameter that gradually decreases toward the hole 28 in the semiconductor chip 20, and on the surface opposite to that of the semiconductor chip 20, the internal diameter of the opening of the hole 46 is larger than the optical fiber 30. The gap between the optical fiber 30 and the internal surface of the hole 46 is preferably filled with a filling material 54 such as resin. The filling material 54 fixes the optical fiber 30 and also functions to prevent its removal.

In this embodiment, the optical element 10 and semiconductor chip 20 are sealed with a resin 56. The resin 56 also seals the electrical connection between the optical element 10 and the semiconductor chip 20 and the electrical connection between the semiconductor chip 20 and the interconnect pattern 48 formed on the substrate 42.

With this embodiment of the optical module, the optical element 10 and semiconductor chip 20 are packaged. Therefore, since it is not always necessary to make a connection of the driver circuit to the optical module, handling is made easier.

This embodiment has the above described construction, and the method of manufacture thereof is now described.

First, an optical element 10, semiconductor chip 20, and optical fiber 30 are prepared. The optical element 10 comprises an optical section 12, and first and second electrodes 14 and 16. On the semiconductor chip 20, preferably on the surface on which the electrodes 22 are formed, the interconnect pattern 24 may also be formed. The hole 28 may be formed in the semiconductor chip 20. Preferably the interconnect pattern 24 and hole 28 of the semiconductor chip 20 are formed with accurate relative positioning.

Figure 2A:
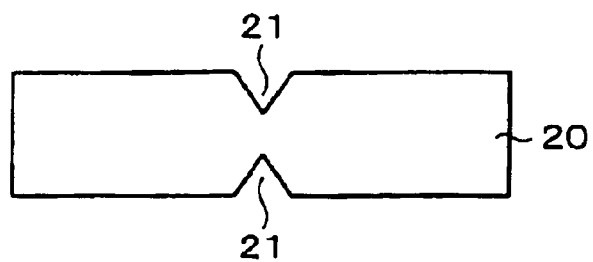
FIGS. 2A to 2C show a method of forming a hole in a semiconductor chip.

The method of forming the hole 28 is now described with reference to FIGS. 2A to 2C. These figures show a vertical sectional view passing through the location of formation of the hole 28 in the semiconductor chip 20. As shown in FIG. 2A, a depression 21 is formed in the semiconductor chip 20. The depression 21 is formed in the location of the opening of the hole 28. Preferably, the depression 21 is formed in both surfaces in which the hole 28 opens. The semiconductor chip 20 is commonly constructed of silicon, and therefore anisotropic etching can be applied to form the depression 21 with a triangular vertical-section accurately along the crystal planes. Alternatively, the depression 21 may be formed with a rectangular vertical-section. The form of the opening of the depression 21 is not particularly restricted, but it may be rectangular. When the opening of the depression 21 is rectangular, the length of one side is preferably more than the diameter of the optical fiber 30. By means of this, at least a part of the depression 21 can form the taper 29.

Figure 2B:
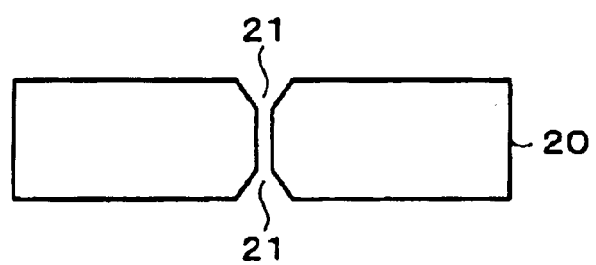
Figure 2C:
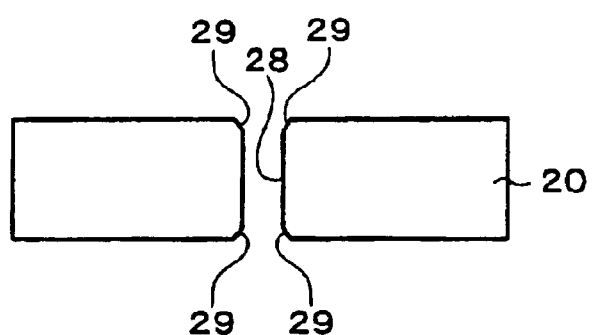

Next, as shown in FIG. 2B, the semiconductor chip 20 is bored between the pair of depressions 21 on mutually opposite sides. For example, a laser can be used. That is to say, laser light can be beamed into one depression 21, and the semiconductor chip 20 bored. Further, to the hole bored between the pair of depressions 21, etching is applied, to increase the diameter of the hole, and form the hole 28 as shown in FIG. 2C. It should be noted that at least a part of the depression 21 is preferably left remaining at the opening of the hole 28. By means of this, at least a part of the depression 21 can form the taper 29.

Alternatively, the optical excitation electropolishing method can be applied to the formation of the hole 28.

This embodiment includes a step of electrically connecting the optical element 10 and semiconductor chip 20. For example, the first electrodes 14 of the optical element 10 and the interconnect pattern 24 formed on the semiconductor chip 20 are bonded. Alternatively, the first electrodes 14 and the electrodes 22 formed on the semiconductor chip 20 are bonded.

As a means of bonding, if solder 26 is used, a self-alignment effect is obtained. That is to say, when molten solder 26 is interposed between the first electrodes 14 and the interconnect pattern 24 or the electrodes 22, the surface tension of the molten solder 26 automatically positions the optical element 10. On the interconnect pattern 24 it is preferable for lands to be formed on which the solder 26 is provided. The positioning of the optical element 10 is carried out by the self-alignment effect, and therefore the optical section 12 of the optical element 10 can be automatically faced to the hole 28 in the semiconductor chip 20.

The second electrodes 16 of the optical element 10 and the interconnect pattern 24 formed on the semiconductor chip 20 are electrically connected. For the connection, wires 27 can be used.

This embodiment includes a step of attaching at least either of the optical element 10 and semiconductor chip 20 to the substrate 42. For example, using the adhesive 44, the semiconductor chip 20 is adhered to the substrate 42. When the hole 28 is formed in the semiconductor chip 20, the hole 46 in the substrate 42 communicates with the hole 28 in the semiconductor chip 20.

This embodiment includes a step of providing external terminals 50 on the substrate 42. In this embodiment, leads being the external terminals 50 are provided on the substrate 42, and are electrically connected to the interconnect pattern 48. The external terminals 50 are electrically connected to at least either of the optical element 10 and semiconductor chip 20 through the interconnect pattern 48.

This embodiment includes a step of relatively positioning and disposing the optical element 10 and optical fiber 30. For example, the optical fiber 30 is inserted in the hole 28 formed in the semiconductor chip 20. It should be noted that if the taper 29 is formed at the opening of the hole 28, the optical fiber 30 can be inserted more easily. If the hole 46 in the substrate 42 is formed so as to enlarge toward the surface from which the optical fiber 30 is inserted, the optical fiber 30 can be inserted more easily.

Simply by inserting the optical fiber 30 in the hole 28, the positioning of the optical fiber 30 and semiconductor chip 20 can be carried out. If the semiconductor chip 20 and optical element 10 are accurately positioned, then the relative positioning of the optical fiber 30 and optical element 10 can be carried out. That is to say, simply by inserting the optical fiber 30 in the hole 28, the relative positioning of the optical fiber 30 and optical element 10 can be carried out.

This embodiment may include a step for preventing the optical fiber 30 from being pulled out. For example, the optical fiber 30 may be passed through the hole 46 in the substrate 42 and inserted in the hole 28 in the semiconductor chip 20, then the hole 46 in the substrate 42 filled with the filling material 54. If the filling material 54 is cured, the optical fiber 30 is fixed to the substrate 42, and therefore the optical fiber 30 can be prevented from being pulled out of the hole 28 in the semiconductor chip 20.

This embodiment may include a step of packaging the optical element 10 and semiconductor chip 20. For example, between the optical element 10 and semiconductor chip 20 is filled with the underfill material 40. By means of this, the surfaces of the optical element 10 and semiconductor chip 20 are protected, the electrical connection between the two is protected, and the connection state of the two is maintained.

Furthermore, at least the exposed surface of the optical element 10 and semiconductor chip 20, the electrical connection between the two, and the electrical connection between at least either of the optical element 10 and semiconductor chip 20 and the interconnect pattern 48 formed on the substrate 42, are preferably sealed with the resin 56 or the like. By means of the above process, an optical module with the optical element 10 and semiconductor chip 20 packaged can be obtained.

The present invention is not limited to the above-described embodiment, and various modifications described below are possible.

Second Embodiment

Figure 3:
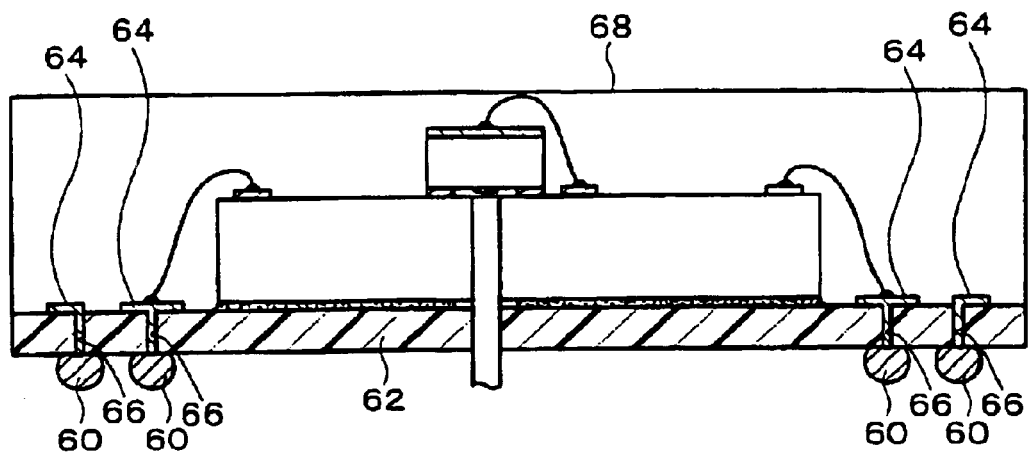
FIG. 3 shows a second embodiment of an optical module to which the present invention is applied.

FIG. 3 shows a second embodiment of an optical module to which the present invention is applied. This optical module differs from the first embodiment in the construction of external terminals 60. That is to say, the external terminals 60 are provided on the surface of a substrate 62. For example, on one surface of the substrate 62 an interconnect pattern 64 is formed, and the external terminals 60, electrically connected to the interconnect pattern 64 through through holes 66, are formed on the other surface of the substrate 62. The external terminals 60 may be for example solder balls. By means of this, the optical module can be surface mounted. The optical module of this embodiment can also be packaged by a resin 68 or the like.

In this embodiment, apart from the above-described points, the description of the first embodiment applies, and more detailed explanation is omitted here.

Third Embodiment

Figure 4:
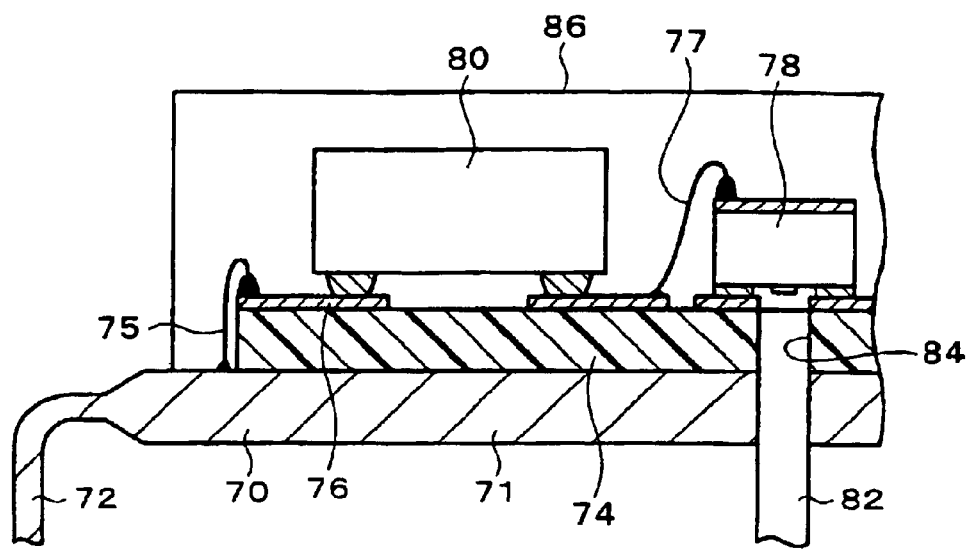
FIG. 4 shows a third embodiment of an optical module to which the present invention is applied.

FIG. 4 shows a third embodiment of an optical module to which the present invention is applied. This optical module has a lead frame 70, and the extremities of the lead frame 70 (outer leads) are external terminals 72.

The lead frame 70 is adhered to a substrate 74. When a semiconductor device lead frame 70 is used, the substrate 74 is adhered to die pads 71 of the lead frame 70. For the adhesion, an adhesive not shown in the drawings can be used. The substrate 74 may be formed of a resin or the like, or may be formed of silicon or glass. On the substrate 74 an interconnect pattern 76 is formed. In particular, when the substrate 74 is formed of silicon, the manufacturing process of the semiconductor device can be applied, and a precision interconnect pattern 76 can be formed.

In this embodiment, an optical element 78 and a semiconductor chip 80 are mounted on the substrate 74. The optical element 78 and semiconductor chip 80 are bonded by face-down bonding to the interconnect pattern 76 on the substrate 74. The interconnect pattern 76 is electrically connected to the lead frame 70 by wires 75 or the like. By means of wires 77, the interconnect pattern 76 and at least either of the optical element 78 and semiconductor chip 80 may be electrically connected.

An optical fiber 82 is positioned by means of a hole 84 formed in the substrate 74. The portion of the lead frame 70 which is adhered to the substrate 74 preferably has formed a hole avoiding the optical fiber 82.

For other aspects of the construction, the description of the first embodiment applies. The optical module of this embodiment is also packaged by a resin 86 or the like.

It should be noted that in place of the "semiconductor chip" of the present invention, a chip including an internal circuit not using a semiconductor may also be applied, and in this case the same benefit as the present invention can be obtained.

Fourth Embodiment

Figure 5:
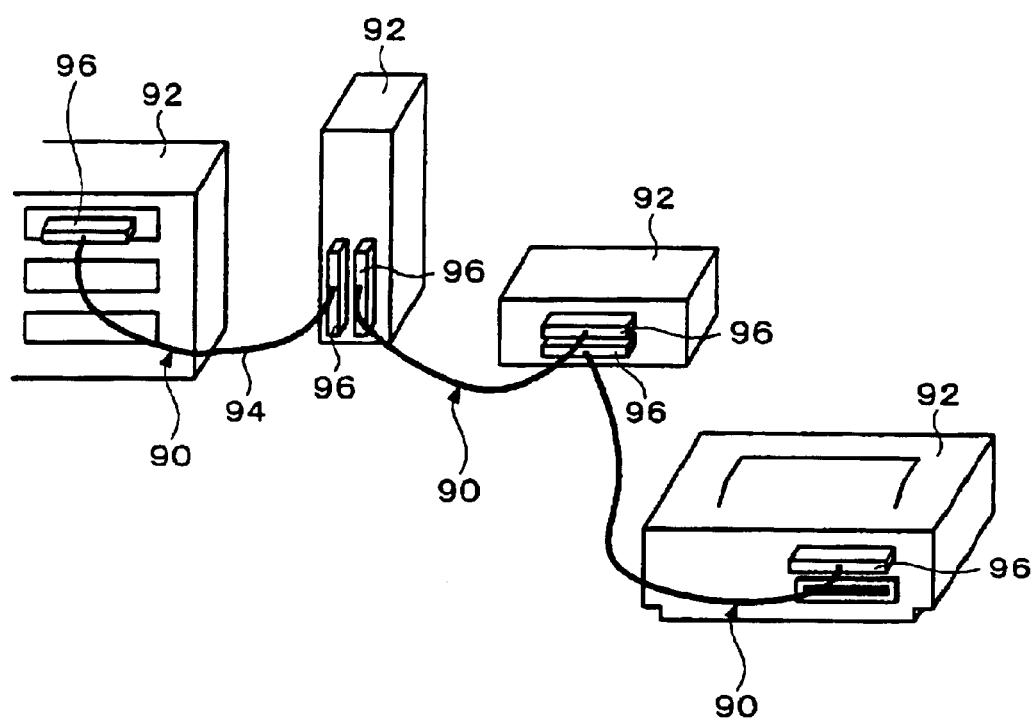
FIG. 5 shows a fourth embodiment of an optical transmission device to which the present invention is applied.

FIG. 5 shows an embodiment of an optical transmission device to which the present invention is applied. An optical transmission device 90 is used to mutually connect electronic instruments 92 such as a computer, a display, a memory device, and a printer. The electronic instruments 92 may equally be data communications devices. The optical transmission device 90 may have plugs 96 provided at both ends of a cable 94. The cable 94 includes one or a plurality of (at least one) optical fiber(s) 30 (see FIG. 1). The plugs 96 incorporate-semiconductor chip 20. The fixing of the optical fiber 30 to the optical element 10 or the semiconductor chip 20 is as described above.

The optical element 20 connected to one end of the optical fiber 30 is a light-emitting element. An electrical signal output from one electronic instrument 92 is converted to an optical signal by the optical element 20 being a light-emitting element. The optical signal passes through the optical fiber 30, and is input to the optical element 20 at the other end. This optical element 20 is an light-receiving element, and converts the input optical signal to an electrical signal. The electrical signal is input to the other electronic instrument 92. In this way, this embodiment of the optical transmission device 90 enables information to be transferred between the electronic instruments 92 by means of an optical signal.

Fifth Embodiment

Figure 6:
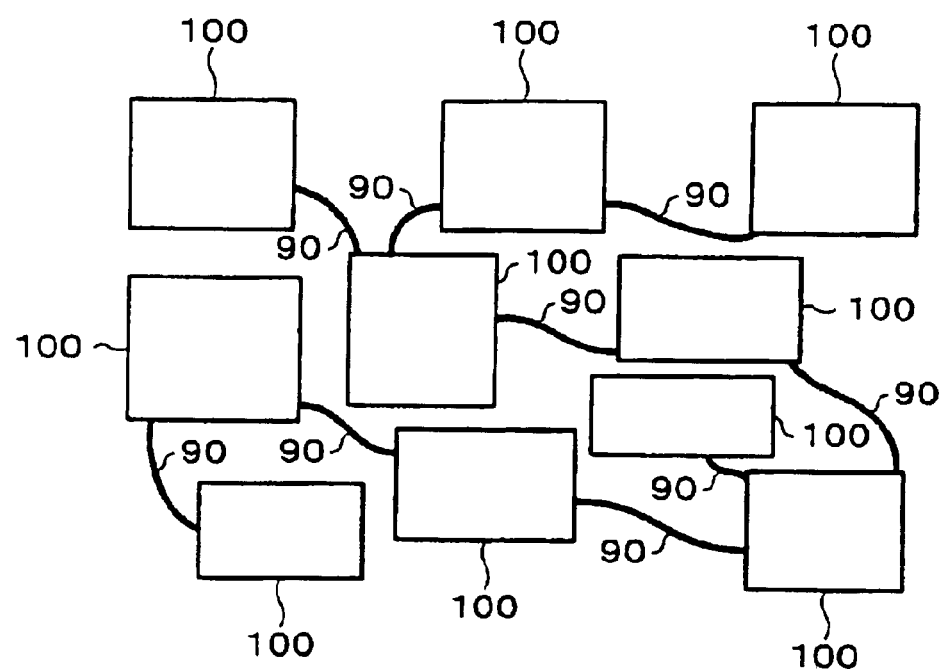
FIG. 6 shows a fifth embodiment of an optical transmission device to which the present invention is applied.

FIG. 6 shows the use of an embodiment of an optical transmission device to which the present invention is applied. The optical transmission device 90 connects electronic instruments 100. As the electronic instruments 100 may be cited liquid crystal display monitors or digital support CRTs (These may be used in the financial, communications marketing, medical, and educational fields.), liquid crystal projectors, plasma display panels (PDP), digital TV, retail cash registers (for Point of Sale Scanning (POS)), video, tuners, games machines, printers, and so on.

Sixth Embodiment

Figure 7:
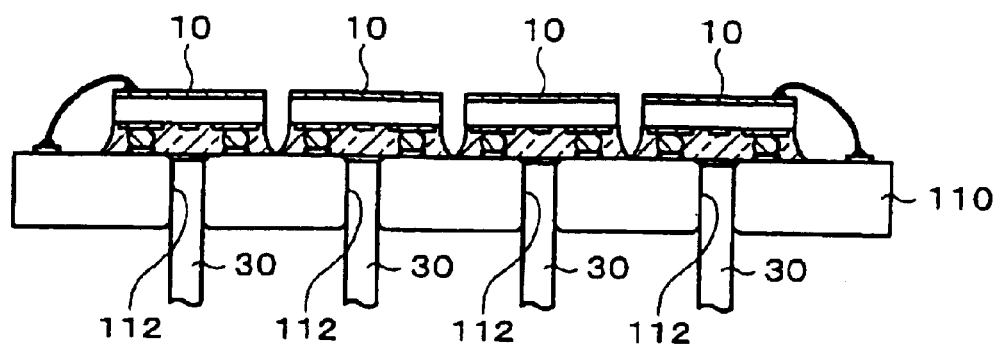
FIG. 7 shows a sixth embodiment of an optical module to which the present invention is applied.

FIG. 7 shows an embodiment of an optical module to which the present invention is applied. This optical module comprises a semiconductor chip 110, a plurality of optical elements 10, and a plurality of optical fibers 30. In the semiconductor chip 110 are formed a plurality of holes 112, and an optical fiber 30 is inserted into each of the holes 112. Corresponding to each optical fiber 30, an optical element 10 is provided. In the example shown in FIG. 7, the optical module has four optical elements 10, and when these are used to transmit a color image signal, the optical elements 10 and optical fibers 30 are used to transmit red, green, and blue signals and a clock signal.

For other aspects of the construction, the description of the first embodiment applies. The optical module of this embodiment can also be packaged by a resin or the like.

Seventh Embodiment

Figure 8:
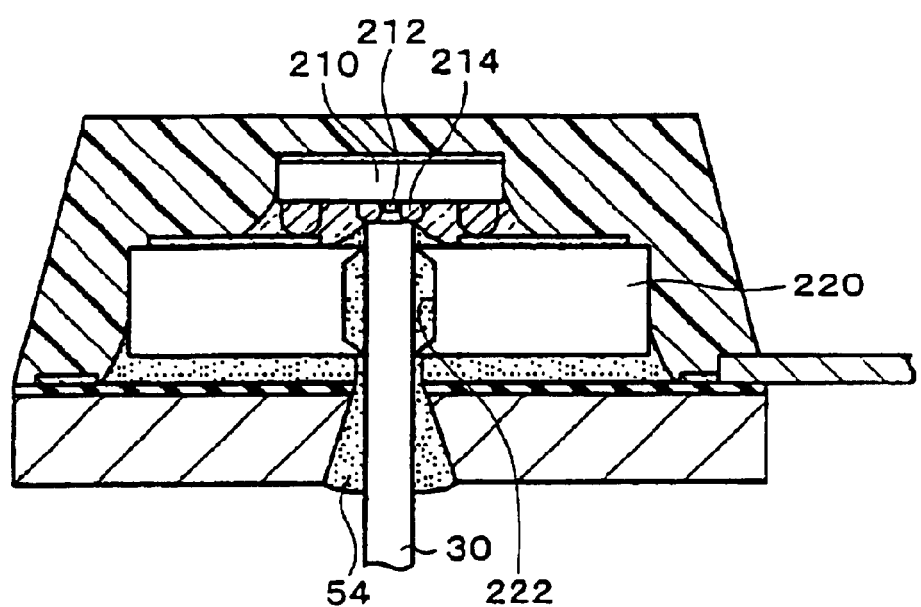
FIG. 8 shows a seventh embodiment of an optical module to which the present invention is applied.

FIG. 8 shows an embodiment of an optical module to which the present invention is applied. This optical module has an optical element 210, a semiconductor chip 220, and an optical fiber 30. The optical element 210 is provided with a stopper 214 so that the end of the optical fiber 30 does not contact an optical section 212. The stopper 214 is provided in a position being the surface of the optical element 210 on which the optical section 212 is provided, corresponding to within the area of the end surface of the optical fiber 30. By forming the stopper 214 to be higher than the optical section 212, the end surface of the optical fiber 30 is prevented from contacting the optical section 212.

In the semiconductor chip 220, a hole 222 is formed for the optical fiber 30 to be passed through. The hole 222 is formed with opening extremities and a central part of larger diameter than the opening extremities. The opening extremities and central part are connected by tapers.

The hole 222 of this shape can be formed as follows. First, a layer patterned to form an opening in the region in which the hole 222 is to be formed is formed on the semiconductor chip 220. This layer may be of resist, or may be an oxide film, or may be a film formed by applying chemical vapor deposition (CVD). Then the opening in the layer of resist or the like (the surface of the semiconductor chip 220) is etched. For the etching it is preferable that dry etching be applied. The dry etching may be reactive ion etching (RIE). As the etching may be applied wet etching. In this way, on the surface of the semiconductor chip 220, a depression (not a through hole) is formed.

Then in the portion of the semiconductor chip 220 where the depression is formed, using a laser (for example a YAG laser or $CO_2$ laser) or the like, a small hole is formed. The laser beam can be directed to recognize the position of the depression. The laser beam may be directed from one side of the semiconductor chip 220, or the laser beam may be directed from both sides of the semiconductor chip 220 (either sequentially or simultaneously). If the laser beam is directed from both sides, the effect on the semiconductor chip 220 is reduced. It should be noted that when directing the laser beam from both sides, it is preferable for depressions to be formed in both surfaces of the semiconductor chip 220.

Next the small hole is enlarged to form the hole 222. For example, applying wet etching, the internal wall of the small hole may be etched. As etchant may be used, for example, a mixture of hydrofluoric acid and ammonium fluoride in aqueous solution (buffered hydrofluoric acid). Then the layer of resist or the like is removed as required.

It should be noted that elements may be formed on the semiconductor chip 220 after forming the hole 222, but if the presence of the hole 222 makes the formation of elements difficult, elements may be formed first.

For other aspects of the construction, the description of the first embodiment applies. The optical module of this embodiment can also be packaged by a resin or the like. It should be noted that the interior of the hole 222 is preferably filled with the filling material 54 fixing the optical fiber 30.

In the above embodiments, an optical fiber was used as an optical waveguide, but a sheet form or strip form optical waveguide may equally be used. The optical waveguide may be formed of polyimide resin.

What is claimed is:

1. An optical module comprising:

an optical waveguide;

an optical element having an optical section;

a semiconductor chip electrically connected to the optical element;

a substrate having a first surface and a second surface, the substrate supporting the semiconductor chip and the optical element on the first surface;

an interconnect pattern formed on the first surface, the interconnect pattern electrically connected to the semiconductor chip; and external terminals provided over the second surface, the external terminals electrically connected to the interconnect pattern, wherein the semiconductor chip and the substrate respectively having first and second holes formed therein and overlapped with each other;

wherein the optical waveguide is inserted into the first and second holes; and wherein the optical element is disposed so that the optical section and one end surface of the inserted optical waveguide are opposed.

2. The optical module according to claim 1, wherein the substrate has through holes formed therein to electrically connect the external terminals to the interconnect pattern.

3. The optical module according to claim 1, wherein the optical element and the semiconductor chip are packaged.

4. The optical module according to claim 3, wherein the semiconductor chip and the optical element are sealed with resin.

5. The optical module according to claim 1, further comprising a transparent underfill material provided between the optical element and the semiconductor chip so as to cover the optical section.

6. The optical module according to claim 1, wherein the semiconductor chip has an internal circuit for driving the optical element.

7. The optical module according to claim 1, wherein the optical element and the semiconductor chip are stacked.

8. The optical module according to claim 1, wherein the interconnect pattern is electrically connected to the optical element.

9. The optical module according to claim 1, wherein the external terminals over the second surface of the substrate are electrically connected to the interconnect pattern on the first surface of the substrate via through holes in the substrate.

10. The optical module according to claim 1, wherein the substrate is conductive and includes an insulative material located at the first surface.

* * * * *